United States Patent Office 3,375,110
Patented Mar. 26, 1968

3,375,110

PHOTO-MASKING SYSTEM USING p-XYLYLENE POLYMERS

William E. Loeb, Martinsville, N.J., assignor to Union Carbide Corporation, a corporation of New York

**No Drawing. Filed Dec. 24, 1964, Ser. No. 421,107
14 Claims. (Cl. 96—36)**

This invention relates to a novel photo-masking system. More particularly, the present invention relates to an ultra-thin, polymeric, positive photo-masking system which provides better resolution and reproduction than heretofore available.

Photo-masking systems are used widely in the manufacture of printed circuits, microcircuits, semi-conductors, precision dies and tools, decorative arts and in other lithographic media. For example, a copper-plated phenolic board to be made into a printed circuit can be first coated with a photosensitive polymer employing conventional methods of application such as dipping, spraying or painting. Then a mask, resembling a photographic negative containing dark and clear portions, is placed over the polymer coating and the composite structure is subjected to irradiation, usually by light from a carbon arc or other similar source. The light, which penetrates the clear areas of the mask, causes a photochemical change, usually cross-linking, to occur in the portions of polymer exposed beneath the mask. After a developing step, the unirradiated polymer is dissolved away leaving a replica of the original mask or negative. The exposed surface of the copper can then be etched producing the desired circuit configuration. Finally, the remaining cross-linked polymer is removed by a strong solvent. The photo-masking system described above is conventionally known as a "negative" masking system, i.e., the exposed portions of the polymer become cross-linked; in a "positive" masking system, the exposed portions of the polymer become soluble. "Positive" masking systems represent an advance over the earlier "negative" masking systems since the unexposed portion constitutes the mask image and the exposed portion can be dissolved away. The positive masking systems thereby enable multiple exposures without the previously existing necessity of applying multiple coatings.

Recently, manufacturers and users of photo-masking systems have been seeking better resolution, i.e., the minimum line width or line separation that can be achieved, and better edge definition, i.e., the magnitude of imperfections occurring along a supposedly straight edge. With presently available photo-masking systems, line widths down to about 0.03 mil and tolerances of $\pm 0.01$ mil can be obtained. Various methods have been employed in an attempt to achieve beter resolution and line definition, including making the polymer coating as thin as possible. However, photo-masking systems presently available are limited to polymer coatings having thicknesses of about $0.5\mu$ and higher.

Accordingly, it is an object of the present invention to provide an ultra-thin photo-masking system.

It is another object of this invention to provide a novel positive photo-masking system exhibiting high resistance to chemical attack.

The present invention provides a photo-masking system comprised of an etchable substrate having a photo-oxidizable coating thereon of a substantially unsaturated p-xylylene polymer having the general repeating unit:

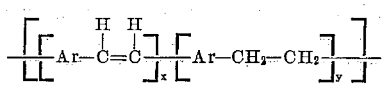

(I)

wherein Ar— is a divalent benzenoid nucleus as hereinafter defined; $x$ is a number from 3 to about 10, inclusive, and $y$ is a number from 0 to about 3, inclusive.

In another aspect, the present invention provides a method for converting substantially insoluble unsaturated p-xylylene polymers having the repeating unit defined above to soluble derivatives thereof by exposing said p-xylylene polymer to light in the presence of oxygen for a sufficient period of time to render said polymer soluble. This method enables the use of substantially unsaturated p-xylylene polymers in selectively etching substrate surfaces thereby providing a novel photo-masking system.

Several methods presently exist for applying a substantially unsaturated p-xylylene polymer to a substrate surface or for depositing a p-xylylene polymer which can undergo elimination in situ resulting in a substantially unsaturated p-xylylene polymer. For example, L. A. R. Hall describes the production of substantially unsaturated p-xylylene polymers containing halogen in United States Patent 2,914,489. In the Hall method, p-xylylene polymers such as those having the following typical repeating units:

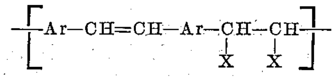

(II)

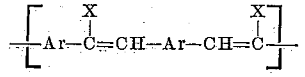

(III)

wherein —Ar— is a divalent aromatic radical and X is halogen, can be prepared by cooling, on a substrate, the pyrolyzed vapors of a compound of the formula $$X—CH_2—Ar—CH_2—Y$$

wherein Ar and X are as above defined, and Y can be hydrogen or halogen; however, when X is chlorine, Y must also be a halogen.

Another method suitable for use in the present invention is the formation of unsaturated p-xylylene polymers in situ by thermal treatment to dehydrohalogenate polymers of the formula

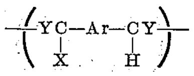

(IV)

wherein Ar— is a divalent benzenoid nucleus, X is a halogen and Y is hydrogen or halogen. These basic alpha-halogenated polymers can be produced by several methods. For example, such polymers can be prepared by dehydrohalogenating an alpha-halo precursor of the formula:

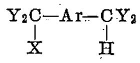

wherein Ar, X and Y are as defined above, with an alkali metal hydroxide or alkoxide. Still another method applicable to produce such polymers is the pyrolytic decomposition of a bis-sulfone having the general formula:

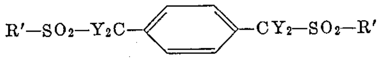

wherein Y is as defined above and R' is a lower hydrocarbon group. Upon pyrolysis, the bis sulfone decomposes to form reactive diradicals having the formula

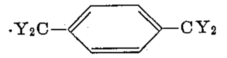

wherein Y is as defined above, which spontaneously polymerize upon cooling to form the above polymer (IV).

Alpha-substituted p-xylylene polymers can also be prepared by the pyrolysis of at least one cyclic dimer represented generally by the structural formula:

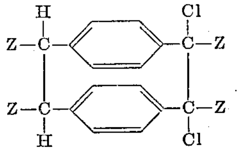

(V)

wherein Z is hydrogen or chlorine. Upon pyrolysis, the cyclic dimer is cleaved into reactive p-xylylene diradicals having the structural formula:

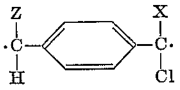

wherein Z is as defined above. Upon cooling below about 200° C., the thus formed diradicals condense and simultaneously polymerize to produce p-xylene polymers having the repeating unit:

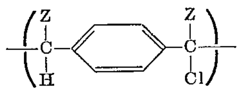

(VI)

wherein Z is as defined above.

The alpha-substituted cyclic di-p-xylylenes (V) can be prepared by several methods. For example, subjecting an admixture of di-p-xylylene and either sulfuryl chloride or t-butyl hypochlorite to ultraviolet irradiation in the presence of a free radical initiator. Also, such cyclic dimers can be obtained by treating di-p-xylylene with N-chlorosuccinimide in a suitable solvent such as carbon tetrachloride.

Inasmuch as the coupling and polymerization of the reactive diradicals formed by the variety of methods hereinabove described does not involve the aromatic ring but only the free radical sites, any unsubstituted or ring and/or alpha substituted p-xylylene polymers can be prepared since the substituent groups function essentially as inert groups. Thus the divalent benzenoid nucleus, Ar—, can be any benzene ring substituted or not with any monovalent inorganic or organic group which can be normally substituted onto an aromatic nucleus.

Notable among the inert monovalent groups that have been substituted on aromatic nuclei or aliphatic α-carbon atoms of such p-xylylene polymers other than hydrogen are the halogens including chlorine, bromine, iodine and fluorine, alkyl groups such as methyl, ethyl, propyl, n-butyl, sec-butyl, tert-butyl, amyl and hexyl, cyano, phenyl, hydroxy, alkoxy, acetoxy, amino, nitro, carboxy, benzyl and other similar groups. While some of the above groups are potentially reactive under certain conditions or with certain reactive materials, they are unreactive under the conditions encountered in the present invention and thus are truly inert.

In view of the above, it can readily be seen that many methods exist which enable the application of an ultra-thin coating of substantially unsaturated p-xylylene polymer on a substrate surface. In instances where a p-xylylene polymer is applied to a substrate and contains labile atoms on the alpha carbons, the unsaturated species can then be formed in situ by eliminating these atoms by thermal treatment or other similar means. For example, in instances wherein the p-xylylene polymer applied to the substrate has the general repeating unit:

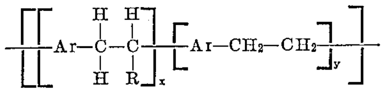

(VII)

wherein Ar is a divalent benzenoid nucleus, R is a member selected from the group consisting of halogen, cyano, hydroxy, and acetoxy, $x$ is a number from 3 to about 10, inclusive, and $y$ is a number from 0 to about 3, inclusive, a molecule of HR can be eliminated by thermal treatment or other similar means to cause dehydrohalogenation, dehydration and the like to provide a substantially unsaturated p-xylylene polymer (I). Elimination of HR molecules can be readily accomplished by heating the coated substrate to temperatures of from about 150°–175° C. for about one to two hours. Lower temperatures can, of course, be employed; however, longer heating periods are then required.

Thus, it is considered as within the scope of the present invention to apply substantially unsaturated p-xylylene polymers directly to substrate surfaces or to apply p-xylylene polymers containing substituents which can undergo elimination in situ on the substrate surfaces to provide substantially unsaturated p-xylylene polymers.

It has been found in accordance with the present invention that a coating of a substantially unsaturated p-xylylene polymer applied to an etchable substrate surface by any convenient route such as those described above results in an ultra-thin photosensitive polymeric coating on such substrate thereby providing a photo-masking system wherein the polymeric coating can be applied in thicknesses of 1000 A. or lower. While it is possible to deposit p-xylylene polymers to any desired thickness simply by regulating deposition time, it is of particular advantage in the present invention to deposit ultra-thin films of such polymers, i.e., films having thicknesses less than about 5000 Angstroms, thereby providing better resolution and reproduction than heretofore available.

Heretofore, p-xylylene polymers have achieved distinction due to their insolubility in all common solvents at room temperatures. It has now been found that the substantially unsaturated p-xylylene polymers, whether applied directed or formed in situ, become completely soluble in dilute basic solutions when exposed to light, e.g., sunlight, ultraviolet light, light from a carbon arc, and other similar light sources exhibiting wave lengths in those portions of the visible and/or ultraviolet spectrum less than about 500 millimicrons and more preferably, less than about 400 millimicrons, in the presence of substantially stoichiometric proportions of oxygen for a sufficient period of time to render the polymer soluble. The requisite exposure time can be readily determined. It is considered critical that oxygen be present during exposure since the unsaturated p-xylylene polymer is stable to light in the absence of oxygen. Although the exposure time is dependent upon the availability of oxygen, the intensity and placement of the light source employed and the thickness of the polymer coating, it has been found, for example, that about 1 minute of exposure time for every 2000 A. thickness of film is sufficient to render the exposed portions completely soluble when a 140-watt high pressure mercury vapor lamp is employed about 1.5 inches from the coated substrate. It is, of course, apparent that the exposure time can be increased or decreased as desired simply by varying the distance of the light source from the substrate or by varying the intensity of the light source itself since exposure time varies directly with the square of the distance of the light source from the substrate and inversely with the intensity of the light source.

While not wishing to be bound by any theory or mechanism, it is believed that upon exposure of the unsaturated p-xylylene polymers to light in the presence of oxygen-photo-oxidation occurs leading to chain fracture and the formation of base soluble aromatic dicarboxylic acids, and carboxyl terminated polymer fragments, as shown by a sample polymer unit as,

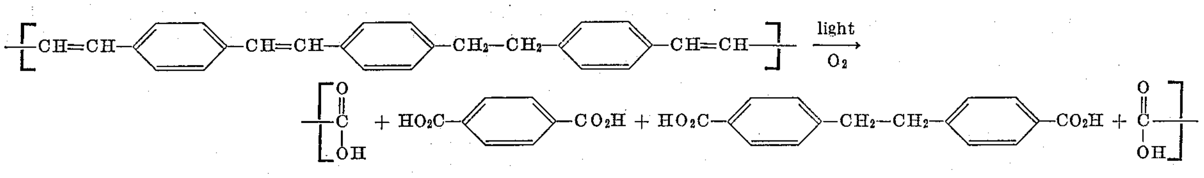

This belief is strengthened by the fact that the exposed portions of the polymer coating are soluble in base. Moreover, acidification of the basic solution results in precipitation of a material which is soluble in dilute sodium bicarbonate with evolution of gas. The precipitate is insoluble in ether and partially soluble in acetone or alcohol. The melting point of the precipitate is over 250° C. These factors are all consistent with the above theory.

The present invention thus provides a method for converting substantially insoluble unsaturated p-xylylene polymers to soluble derivatives thereof by exposing said polymer to light in the presence of oxygen for at least a sufficient period to render said polymer soluble. Due to the ability of unsaturated p-xylylene polymers to be converted into a soluble form, a novel positive photo-masking system is thereby provided. Accordingly, it is now possible to selectively etch substrate surfaces and obtain better resolution and reproduction than heretofore attained by applying to etchable substrates such as metals, as for example, copper, aluminum, glass, quartz, ceramics, semi-conductors such as silicon and germanium and the like, an ultra-thin film, i.e., about 5000 A. or lower, of a substantially unsaturated p-xylylene polymer having the repeating unit:

$$\left[\left[Ar-\overset{H}{C}=\overset{H}{C}\right]_x\left[Ar-CH_2-CH_2\right]_y\right]$$

wherein Ar— is a divalent benzenoid nucleus as hereinabove defined, either directly or by conversion in situ as described above. Thereafter, the coated substrate can be masked with a photographic negative or other similar means to selectively expose predetermined portions of the coated substrate. The composite structure is thereupon exposed to light in the presence of oxygen for a sufficient period of time to render soluble the portions of the polymer coating exposed by the mask. The soluble portions of said coated substrate can be dissolved with a dilute base such as sodium hydroxide, potassium hydroxide, sodium carbonate, trisodium phosphate, pyridine, and the like. The choice of base is not critical since any base is suitable; however, the weaker bases such as pyridine act considerably slower. After dissolving the exposed polymer portions, the etchable surface is laid bare in the desired configuration. Due to the excellant resistance to chemical attack of the unsaturated p-xylylene polymers, the coated structure can be dipped directly into a suitable etchant or the etchant can be applied in any other convenient way without fear of destroying the polymeric film barrier.

It has been found that etchants such as nitric acid, concentrated hydrofluoric acid, mixtures of hydrofluoric acid with up to 25 percent concentrated nitric acid, aqua regia, and conventional anodizing solutions such as that consisting of ethylene glycol, oxalic acid and water in a volume ratio of 3:1:2, do not destroy the coherent film. Nitric acid and aqua regia slowly bleach the polymer but still leave a coherent film.

Once the etchable substrate has been etched, the residual polymer coating can be easily removed from those portions of the substrate previously unexposed by repeating the above sequence, i.e., exposing said portions to light in the presence of oxygen to render them soluble and thereafter removing the soluble portions by contact with a base. After removing the residual polymer, the substrate is laid bare exhibiting the desired configuration selectively etched therein.

The present invention is further illustrated by the following examples. These examples are merely illustrative and are not to be construed in derogation of the spirit or scope of the present invention. Unless otherwise specified all aparts and percentages are by weight.

EXAMPLE 1

Alpha di-chloro-di-p-xylylene was prepared by subjecting an admixture of di-p-xylylene in carbon tetrachloride and sulfuryl chloride to ultraviolet irradiation in the presence of a catalytic amount of benzoyl peroxide. Fifty milligrams of alpha dichloro-di-p-xylylene as prepared above was placed within a boro-silicate glass sublimation chamber measuring 2 inches in diameter and 4 inches long. A thermocouple gauge registered the pressure at one end of the chamber, the other end of said chamber being connected by a standard taper joint to a 1⅜ inch diameter quartz pyrolysis tube 26 inches long. The alpha dichloro-di-p-xylylene was sublimed at an outside temperature of about 150° C. and a pressure of about 0.2 mm. Hg. The vapors passed through a 6-inch section of the pyrolysis tube (vaporization zone) heated to 200° C. and then through a 19 inch length (pyrolysis zone) maintained at temperatures between about 600° C.–650° C. Connected to the terminal portion of the pyrolysis tube via a 5-inch long flanged dome was a deposition chamber 3 inches in diameter and 15 inches long. Excess vapors were condensed in a Dry Ice-acetone trap. A 4-c.f.m. vacuum pump maintained the pressure at about 0.015 mm. Hg. Quartz slides were placed in the deposition zone.

The alpha dichloro-di-p-xylylene sublimed and was pyrolyzed to form alpha chloro-p-xylylene diradicals which condensed and polymerized in the deposition zone which was maintained at room temperature to form a coating of poly(α-chloro-p-xylylene) on the quartz slides. There was no evidence of significant loss in the chlorine content through dehydrochlorination during the polymerization process.

A faint rainbow was observed to move across the chamber during the run resulting from the interference pattern caused by the depositing film. Therefore, since each interference band results from a change in thickness of 2000 A., the thickness of the deposited film was in this range.

The quartz slides were removed from the deposition zone and subjected to ultraviolet spectroscopy. The as-deposited film had peaks at 204 mμ, log E about 4.7; 232 mμ, log E about 4.4; and a shoulder at 265 mμ. Heating the slides at 175° C. for one hour developed a yellow-green color in the film and a broad, jagged peak between 300 and 400 mμ, log E about 4.3 which is consistent with a highly conjugated structure.

The coated slides were partially masked with aluminum foil and exposed 1½ inches away from a 140-watt high pressure mercury vapor lamp. The unmasked portions of the coated slide were bleached colorless in about one minute. Spectrophotometric examination of the exposed portions of the film showed that the broad peak between 300 and 400 mμ was gone and that the peaks at 204 mμ and 232 mμ were drastically reduced in intensity.

The exposed portions of the film were completely and rapidly soluble in hot, i. e., about 100° C., 2 percent aqueous sodium hydroxide solution.

The alkaline washes from several such experiments were combined and acidified with hydrochloric acid. A yellow precipitate formed which was collected by filtration and washed with water. The solid was soluble in acetone, insoluble in ether and dissolved in dilute sodium bicarbonate with evolution of carbon dioxide. It did not melt below 260° C. The data are consistent with the product being a mixture of terephthalic acid and p,p'-dicarboxydibenzyl.

EXAMPLE 2

Ninety milligrams of side-chain chlorinated di-p-xylylene prepared in the manner described in Example 1 was placed in the vaporization zone of the vaporization-pyrolyzation furnace described in Example 1. The material sublimed at 175° C. and was pyrolyzed at 650° C. to form side-chain chlorinated p-xylylene diradicals which condensed and polymerized in the deposition zone maintained at room temperature. The entire system was maintained at a pressure of 20–30 micron Hg. Copper foil had been placed in the deposition zone prior to pyrolysis. A coating of poly(α-chloro-p-xylylene) 5000 A. in thickness was formed on the copper foil. The resulting coated copper foil was heated at 175° C. for 90 minutes. A mask consisting of aluminum foil having a plurality of holes therein was placed over the coated copper foil and the composite structure was exposed for at least 3–5 minutes to a 140-watt high pressure mercury vapor lamp, 1½ inches away. The exposed sections were washed away quickly and completely with cold 2 percent aqueous sodium hydroxide solution. The exposed sections of the copper foil were then etched for 5 minutes with hot, i.e., about 80° C., dilute nitric acid producing a fairly deep etch. The residual coating on the copper foil was thereafter removed by again exposing the copper foil for 3–5 minutes to the high pressure mercury vapor lamp as above and thereafter washing with aqueous sodium hydroxide solution to produce the copper foil having the desired configuration etched therein.

EXAMPLE 3

Copper foil was coated in the manner described in Example 2 resulting in a 2000 Angstrom coating of poly(α-chloro-p-xylylene) thereon. The resulting coated foil was heated at 175° C. for 90 minutes. A mask consisting of aluminum foil having a plurality of holes therein was placed on the coated copper foil and the composite structure was exposed for 10 minutes to a 220-volt 90-ampere carbon arc lamp having 9-millimeter diameter, high intensity, No. 98 photocarbon rods, spaced 12 inches therefrom. The exposed portions were washed away quickly and completely by dipping the coated foil in cold 2 percent equeous sodium hydroxide solution. The exposed portions of the copper foil were then etched for 5 minutes with hot, dilute nitric acid producing a fairly deep etch.

What is claimed is:

1. Method for converting substantially insoluble, unsaturated p-xylylene polymers having the repeating unit:

$$\left[\left[-Ar-\overset{H}{\overset{|}{C}}=\overset{H}{\overset{|}{C}}-\right]_x\left[-Ar-CH_2-CH_2-\right]_y\right]$$

wherein Ar— is a divalent benzenoid nucleus; $x$ is a number from 3 to about 10, inclusive, and $y$ is a number from 0 to about 3, inclusive; to soluble derivatives thereof which comprises exposing said polymer to light in the presence of oxygen.

2. Method as defined in claim 1 wherein the source of light exhibits wave lengths in those portions of the visible and ultraviolet spectrum less than about 500 millimicrons.

3. Method as defined in claim 1 wherin oxygen is present during exposure in substantially stoichiometric proportions.

4. Method for photo-oxidizing substantially insoluble, unsaturated p-xylylene polymers having the repeating unit:

$$\left[\left[-Ar-\overset{H}{\overset{|}{C}}=\overset{H}{\overset{|}{C}}-\right]_x\left[-Ar-CH_2-CH_2-\right]_y\right]$$

wherein Ar— is a divalent benzenoid nucleus, $x$ is a number from 3 to about 10, inclusive; and $y$ is a number from 0 to about 3, inclusive; to soluble derivatives which comprises exposing said polymer to light exhibiting wavelengths in those portions of the visible and ultraviolet spectrum less than about 500 millimicrons in the presence of substantially stoichiometric proportions of oxygen.

5. Method for selectively exposing substrate surfaces which comprises:

(a) masking an etchable substrate coated with a substantially unsaturated p-xylylene polymer having the repeating unit:

$$\left[\left[-Ar-\overset{H}{\overset{|}{C}}=\overset{H}{\overset{|}{C}}-\right]_x\left[-Ar-CH_2-CH_2-\right]_y\right]$$

wherein Ar— is a divalent benzenoid nucleus, $x$ is a number from 3 to about 10, inclusive; and $y$ is a number from 0 to about 3, inclusive, to selectively expose predetermined portions of said substrate;

(b) exposing the composite structure to light in the presence of oxygen to render soluble the exposed portions of said p-xylylene polymer on said substrate; and thereafter, (c) dissolving the soluble portions of said p-xylylene polymer on said substrate.

6. Method as defined in claim 5 wherein the source of light exhibits wavelengths in those portions of the visible and ultraviolet spectrum less than about 500 millimicrons.

7. Method as defined in claim 5 wherein oxygen is present during exposure is substantially stoichiometric proportions.

8. Method for selectively etching substrate surfaces which comprises:

(a) masking an etchable substrate coated with a substantially unsaturated p-xylylene polymer having the repeating unit:

$$\left[\left[-Ar-\overset{H}{\overset{|}{C}}=\overset{H}{\overset{|}{C}}-\right]_x\left[-Ar-CH_2-CH_2-\right]_y\right]$$

wherein Ar— is a divalent benzenoid nucleus, $x$ is a number from 3 to about 10, inclusive, and $y$ is a number from 0 to about 3, inclusive, to selectively expose predetermined portions of said substrate;

(b) exposing the composite structure to light in the presence of oxygen to render soluble the exposed portions of said p-xylylene polymer on said substrate;

(c) dissolving the soluble portions of said p-xylylene polymer on said substrate; and thereafter, (d) etching the exposed substrate with a suitable etchant.

9. Method as defined in claim 8 wherein the residual polymer coating is removed from those portions of the substrate previously unexposed by repeating steps (b) and (c) above.

10. Method for selectively etching substrate surfaces which comprises:

(a) applying to an etchable substrate a p-xylylene polymer having the repeating unit:

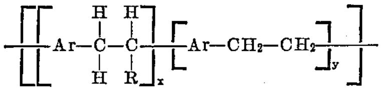

wherein Ar— is a divalent benzenoid nucleus and R is a member selected from the group consisting of halogen, cyano, hydroxy, and acetoxy; $x$ is a number from 3 to 10, inclusive, and $y$ is a number from 0 to about 3, inclusive;

(b) substantially eliminating a molecule of HR from said p-xylylene polymer to form a substantially unsaturated p-xylylene polymer having the repeating unit:

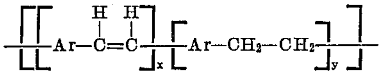

wherein Ar— is a divalent benzenoid nucleus, $x$ is a number from 3 to about 10, inclusive, and $y$ is a number from 0 to about 3, inclusive;

(c) masking the coated substrate to selectively expose predetermined portions of said substrate;

(d) exposing the composite structure to light in the presence of oxygen to render soluble the exposed portions of said p-xylylene polymer on said substrate;

(e) dissolving the soluble portions of said p-xylylene polymer on said substrate;

(f) etching the exposed substrate with a suitable etchant; and thereafter (g) removing the residual polymer coating from those portions of the substrate previously unexposed by repeating steps (d) and (e) above.

11. Method as defined in claim 10 wherein the source of light exhibits wavelengths in those portions of the visible and ultraviolet spectrum less than about 500 millimicrons.

12. Method as defined in claim 10 wherein oxygen is present during exposure in substantially stoichiometric proportions.

13. Photo-masking system as defined in claim 12 wherein the photo-oxidizable coating is obtained in situ from a p-xylylene polymer having the repeating unit:

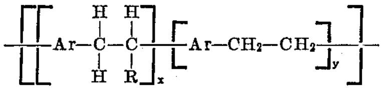

wherein R is a divalent benzenoid nucleus and R is a member selected from the group consisting of halogen, cyano, hydroxy and acetoxy, $x$ is a number from 3 to about 10, inclusive, and $y$ is a number from 0 to about 3, inclusive.

14. Photo-masking system comprised of an etchable substrate having a photo-oxidizable coating thereon of a substantially unsaturated p-xylylene polymer having the repeating unit:

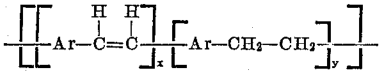

wherein Ar— is a divalent benzenoid nucleus; $x$ is a number from 3 to about 10, inclusive; and $y$ is a number from 0 to about 3, inclusive.

References Cited

UNITED STATES PATENTS

| | | | |
|---|---|---|---|
| 2,892,712 | 6/1959 | Plambeck | 96—35 |
| 2,914,489 | 11/1959 | Hall | 260—2 |
| 3,294,531 | 12/1966 | Schlesinger | 260—2 X |

OTHER REFERENCES

The Chemical Age, Jan. 8, 1955, "Degradation of Plastics," pp. 149–153, J. R. Majer.

NORMAN G. TORCHIN, *Primary Examiner.*

R. E. MARTIN, *Assistant Examiner.*